United States Patent
Yamada

(10) Patent No.: US 9,853,138 B2
(45) Date of Patent: Dec. 26, 2017

(54) III-N BASED HIGH POWER TRANSISTOR WITH INALGAN BARRIER

(71) Applicant: FUJITSU LIMITED, Kawasaki-shi, Kanagawa (JP)

(72) Inventor: Atsushi Yamada, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/286,742

(22) Filed: Oct. 6, 2016

(65) Prior Publication Data
US 2017/0125567 A1     May 4, 2017

(30) Foreign Application Priority Data

Oct. 30, 2015  (JP) ................................. 2015-215111

(51) Int. Cl.
| | |
|---|---|
| H01L 29/778 | (2006.01) |
| H01L 21/324 | (2006.01) |
| H01L 21/02 | (2006.01) |
| H01L 21/306 | (2006.01) |
| H01L 29/20 | (2006.01) |
| H01L 29/66 | (2006.01) |

(52) U.S. Cl.
CPC ...... *H01L 29/7787* (2013.01); *H01L 21/0254* (2013.01); *H01L 21/30604* (2013.01); *H01L 21/3247* (2013.01); *H01L 29/2003* (2013.01); *H01L 29/66462* (2013.01)

(58) Field of Classification Search
CPC ................ G01K 7/01; H01L 21/30612; H01L 29/30612; H01L 29/4236; H01L 29/66848–29/66886; H01L 29/41758; H01L 29/155; H01L 29/2003; H01L 29/7788

USPC ........................................................... 257/76
See application file for complete search history.

(56) References Cited

U.S. PATENT DOCUMENTS

| | | | | |
|---|---|---|---|---|
| 2011/0297961 | A1* | 12/2011 | Bunin | H01L 29/42316 257/76 |
| 2016/0329421 | A1* | 11/2016 | Shibata | H01L 29/861 |
| 2017/0025523 | A1* | 1/2017 | Prechtl | H01L 23/49562 |

FOREIGN PATENT DOCUMENTS

JP        2010-074047        4/2010

OTHER PUBLICATIONS

Faiza Afroz Faria et al., "Ultra-low resistance ohmic contacts to GaN with high Si doping concentrations grown by molecular beam epitaxy," AIP Applied Physics Letters 101, 032109 (2012), pp. 032109-1 to 032109-4 (5 pages).

\* cited by examiner

*Primary Examiner* — Evan Pert
*Assistant Examiner* — Changhyun Yi
(74) *Attorney, Agent, or Firm* — Fujitsu Patent Center

(57) ABSTRACT

A semiconductor device includes a substrate, a first semiconductor layer formed over the substrate, a plurality of contact layers formed over portions of the first semiconductor layer, a second semiconductor layer formed over another portion of the first semiconductor layer and on side surfaces of the contact layers, a source electrode formed on one of the contact layers, a drain electrode formed on another one of the contact layers, and a gate electrode formed on the second semiconductor layer. The first semiconductor layer is formed of a material including GaN, the second semiconductor layer is formed of $In_{x1}Al_{y1}Ga_{1-x1-y1}N$ ($0<x1\leq0.2$, $0<y1<1$), and the contact layers are formed of a material including GaN.

11 Claims, 17 Drawing Sheets

III-N BASED HIGH POWER TRANSISTOR WITH INALGAN BARRIER

CROSS-REFERENCE TO RELATED APPLICATION

This application is based upon and claims the benefit of priority of Japanese Patent Application No. 2015-215111 filed on Oct. 30, 2015, the entire contents of which are incorporated herein by reference.

FIELD

An aspect of this disclosure relates to a semiconductor device, a power-supply device, an amplifier, and a method for producing the semiconductor device.

BACKGROUND

Application of nitride semiconductors having a high saturation electron velocity and a wide band gap to high-withstand-voltage, high-power semiconductor devices is being considered. For example, GaN, which is a nitride semiconductor, has a band gap of 3.4 eV that is greater than the band gap 1.1 eV of Si and the band gap 1.4 eV of GaAs, and has a high breakdown field strength. For this reason, a nitride semiconductor such as GaN is a very promising material for a high-voltage-operation, high-power semiconductor device for a power supply.

Many reports have been made on field effect transistors, particularly, high electron mobility transistors (HEMT), which are examples of semiconductor devices using nitride semiconductors. As an example of a HEMT using nitride semiconductors, an InAlN/GaN HEMT, which uses GaN as a channel layer and InAlN as a barrier layer, is getting attention. In an InAlN/GaN HEMT, the lattice matching between InAlN and GaN can be achieved and a high-quality crystal film can be obtained by setting the composition ratio of In at 17% to 18%. Also, when InAlN is formed with such a composition ratio, the formed InAlN has very high spontaneous polarization. Therefore, an InAlN/GaN HEMT can generate a two-dimensional electron gas (2DEG) having a density greater than the density of the two-dimensional electron gas generated by an AlGaN/GaN HEMT using AlGaN for a channel layer. For the above reason, HEMTs using InAlN as the barrier layer are getting attention as next-generation high-power devices (see, for example, Japanese Laid-Open Patent Publication No. 2010-74047; and F. A. Faria et al., "Ultra-low resistance ohmic contacts to GaN with high Si doping concentrations grown by molecular beam epitaxy," Appl. Phys. Lett., 101, (2012) 032109).

SUMMARY

According to an aspect of this disclosure, there is provided a semiconductor device that includes a substrate, a first semiconductor layer formed over the substrate, a plurality of contact layers formed over portions of the first semiconductor layer, a second semiconductor layer formed over another portion of the first semiconductor layer and on side surfaces of the contact layers, a source electrode formed on one of the contact layers, a drain electrode formed on another one of the contact layers, and a gate electrode formed on the second semiconductor layer. The first semiconductor layer is formed of a material including GaN, the second semiconductor layer is formed of $In_{x1}Al_{y1}Ga_{1-x1-y1}N$ ($0<x1\le0.2$, $0<y1<1$), and the contact layers are formed of a material including GaN.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1A:
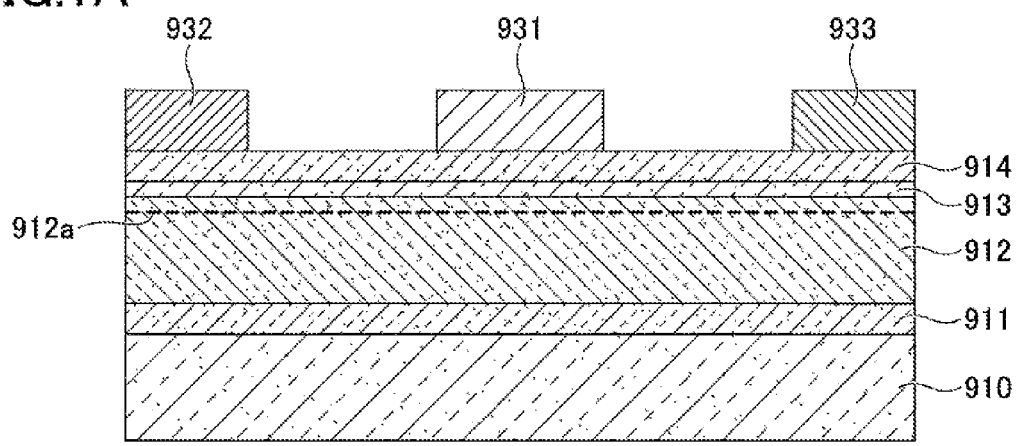
FIGS. 1A and 1B are drawings illustrating semiconductor devices including a barrier layer formed of InAlN.

When a barrier layer of a HEMT is formed of InAlN, due to the wide band gap of InAlN, the contact resistance between the barrier layer and electrodes becomes high, and the on-state current becomes low. FIG. 1A illustrates a HEMT that is an example of a semiconductor device including a barrier layer formed of InAlN. In FIG. 1A, nitride semiconductor layers are stacked on a substrate 910 such as an SiC substrate. The semiconductor device of FIG. 1A includes a nucleation layer 911 formed of AlN, a channel layer 912 formed of GaN, a spacer layer 913 formed of AlN, and a barrier layer 914 formed of InAlN that are stacked in sequence on the substrate 910. With this configuration, a 2DEG 912a is generated in the channel layer 912 near the interface between the channel layer 912 and the spacer layer 913. A gate electrode 931, a source electrode 932, and a drain electrode 933 are formed on the barrier layer 914 formed of InAlN. Because InAlN has a wide band gap, the contact resistance (electrode contact resistance) between the barrier layer 914 and each of the source electrode 932 and the drain electrode 933 becomes high, and the on-state current becomes low.

Figure 1B:
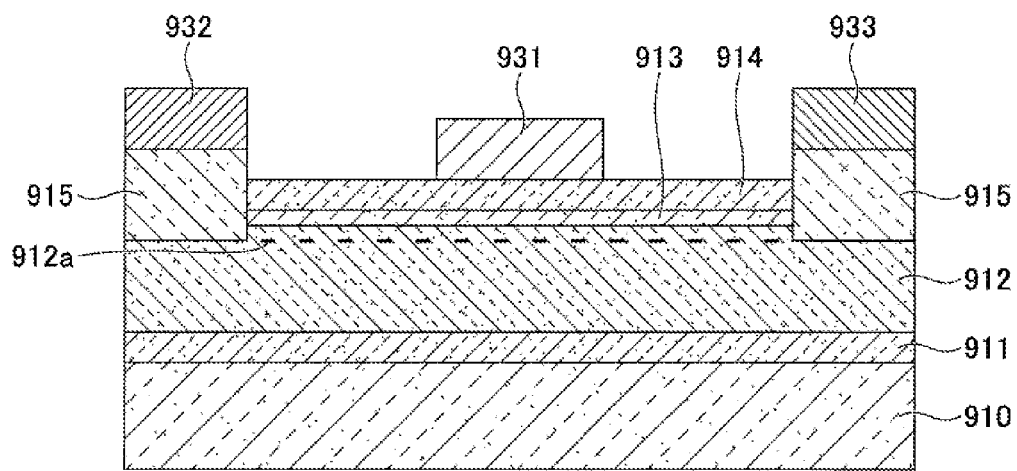

FIG. 1B illustrates an exemplary semiconductor device configured to reduce the electrode contact resistance. In the semiconductor device of FIG. 1B, portions of InAlN layers, which correspond to areas where the source electrode 932 and the drain electrode 933 are to be formed, are removed by etching, and n-GaN is regrown in the areas where the InAlN layers are removed. The source electrode 932 and the drain electrode 933 are formed on the regrown n-GaN to reduce the contact resistance. In producing the semiconductor device of FIG. 1B, the nucleation layer 911 formed of AlN, the channel layer 912 formed of GaN, the spacer layer 913 formed of AlN, and the barrier layer 914 formed of InAlN are stacked in sequence on the substrate 910 such as an SiC substrate. Next, portions of the barrier layer 914, the spacer layer 913, and the channel layer 912, which correspond to areas where the source electrode 932 and the drain electrode 933 are to be formed, are removed, and regrown layers 915 of n-GaN are formed in these areas. Then, the source electrode 932 and the drain electrode 933 are formed on the regrown layers 915, and the gate electrode 931 is formed on the barrier layer 914. With this configuration, however, because the semiconductor device is heated when the regrown layers 915 of n-GaN are formed, In is removed from InAlN forming the barrier layer 914, and the barrier layer 914 is damaged. If the barrier layer 914 is damaged, the 2DEG 912a generated in the channel layer 912 decreases, the sheet resistance of the 2DEG 912a increases, and the on resistance increases.

For the above reasons, there is a demand for a semiconductor device, e.g., a HEMT, that includes a barrier layer formed of InAlN and can still achieve a low electrode contact resistance and a low 2DEG sheet resistance.

Embodiments of the present invention are described below with reference to the accompanying drawings. The same reference numbers are assigned to the same components throughout the drawings, and repeated descriptions of those components are omitted.

First Embodiment

<Semiconductor Device>

Figure 2:
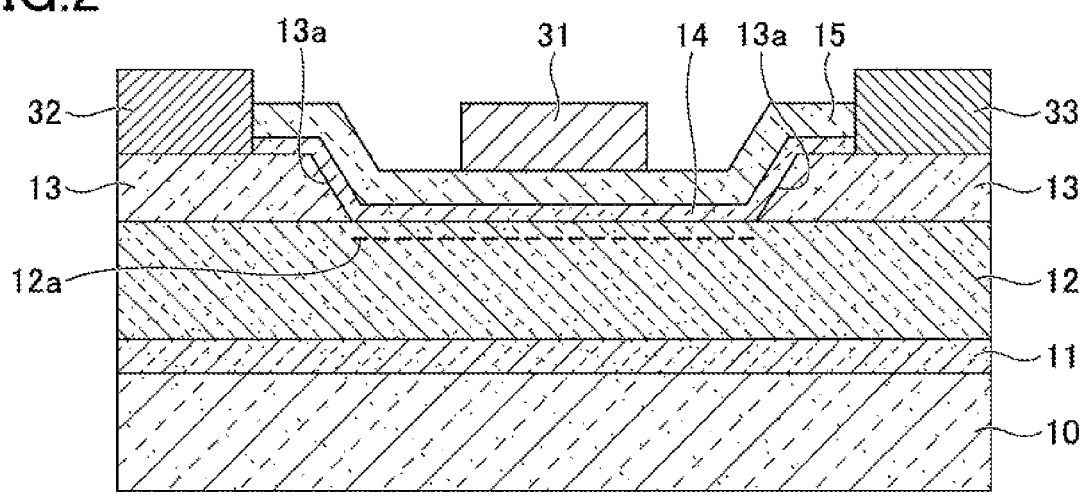
FIG. 2 is a drawing illustrating an exemplary configuration of a semiconductor device according to a first embodiment.

A semiconductor device according to a first embodiment is described. As illustrated by FIG. 2, the semiconductor device of the first embodiment includes a substrate 10 such as a semi-insulating SiC substrate, and a nucleation layer 11 and a channel layer 12 that are formed on the substrate 10. Contact layers 13 are formed on portions of the channel layer 12 corresponding to areas where a source electrode 32 and a drain electrode 33 are to be formed, and the source electrode 32 and the drain electrode 33 are formed on the contact layers 13. On a portion of the channel layer 12 where the contact layers 13 are not formed and on side surfaces 13a of the contact layers 13, a spacer layer 14 and a barrier layer 15 are stacked in sequence. With this configuration, a 2DEG 12a is generated in the channel layer 12 near the interface between the channel layer 12 and the spacer layer 14. Also, a gate electrode 31 is formed on a portion of the barrier layer 15 corresponding to an area where the contact layers 13 are not formed. The contact layers 13 may be wider than the source electrode 32 and the drain electrode 33, and the spacer layer 14 and the barrier layer 15 may be formed also on portions of the contact layers 13 where the source electrode 32 and the drain electrode 33 are not formed.

Accordingly, in the semiconductor device of the first embodiment, the spacer layer 14 is formed between the channel layer 12 and the barrier layer 15 and between the contact layers 13 and the barrier layer 15. As illustrated in FIG. 2, the side surfaces 13a of the contact layers 13 may be inclined such that the contact layers 13 become gradually wider toward the substrate 10. With this configuration, the 2DEG 12a is generated even near the interfaces of the side surfaces 13a of the contact layers 13. This in turn makes it possible to further reduce the resistance. In the present application, the channel layer 12 may be referred to as a "first semiconductor layer", the barrier layer 15 may be referred to as a "second semiconductor layer", and the spacer layer 14 may be referred to as a "third semiconductor layer". The nucleation layer 11 is formed of AlN, the channel layer 12 is formed of i-GaN, the contact layer 13 is formed of n-GaN, the spacer layer 14 is formed of AlN, and the barrier layer 15 is formed of InAlN.

Figure 3:
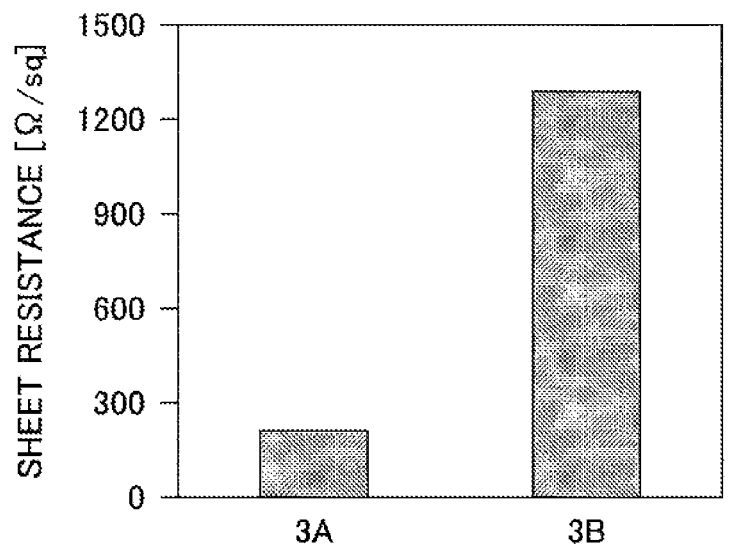
FIG. 3 is a graph illustrating 2DEG sheet resistances in semiconductor devices.

Next, a 2DEG sheet resistance and an electrode contact resistance in the semiconductor device (FIG. 2) of the first embodiment are described. FIG. 3 is a graph illustrating 2DEG sheet resistances in semiconductor devices. In FIG. 3, 3A indicates the 2DEG sheet resistance in the semiconductor device of FIG. 2 of the first embodiment, and 3B indicates the 2DEG sheet resistance in the semiconductor device of FIG. 1B. The 2DEG sheet resistance 3B in the semiconductor device of FIG. 1B is about 1300 Ω/sq. On the other hand, the 2DEG sheet resistance 3A in the semiconductor device of FIG. 2 of the first embodiment is about 200 Ω/sq. Thus, the 2DEG sheet resistance in the semiconductor device of the first embodiment is about one sixth of the 2DEG sheet resistance in the semiconductor device of FIG. 1B.

Figure 4:
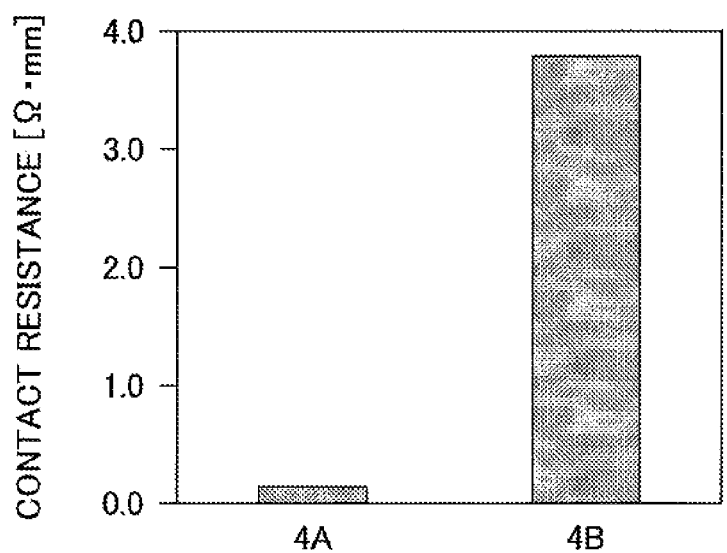
FIG. 4 is a graph illustrating electrode contact resistances in semiconductor devices.

FIG. 4 is a graph illustrating electrode contact resistances in semiconductor devices. In FIG. 4, 4A indicates the electrode contact resistance in the semiconductor device of FIG. 2 of the first embodiment, and 4B indicates the electrode contact resistance in the semiconductor device of FIG. 1A. The electrode contact resistance 4B in the semiconductor device of FIG. 1A is about 3.8 Ω·mm. On the other hand, the electrode contact resistance 4A in the semiconductor device of FIG. 2 of the first embodiment is about 0.12 Ω·mm. Thus, the electrode contact resistance in the semiconductor device of the first embodiment is about one thirtieth of the electrode contact resistance in the semiconductor device of FIG. 1A.

As described above, the configuration of the first embodiment makes it possible to reduce both the 2DEG sheet resistance and the electrode contact resistance in a semiconductor device. In the first embodiment, the barrier layer 15 is formed with InAlN after the contact layers 13 are formed with n-GaN. That is, InAlN is formed after n-GaN is formed. Accordingly, InAlN forming the barrier layer 15 is not damaged, and the 2DEG sheet resistance in the semiconductor device of the first embodiment is greatly reduced to about one sixth of the 2DEG sheet resistance in the semiconductor device of FIG. 1B. Also, because the source electrode 32 and the drain electrode 33 are formed on the contact layers 13 made of n-GaN, the electrode contact resistance in the semiconductor device of the first embodiment is greatly reduced to about one thirtieth of the electrode contact resistance in the semiconductor device of FIG. 1A.

<Method of Producing Semiconductor Device>

Next, an exemplary method of producing a semiconductor device according to the first embodiment is described with reference to FIGS. 5A through 6C.

Figure 5A:
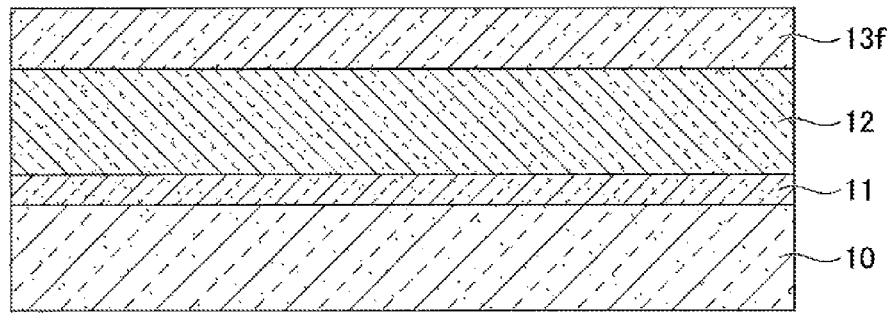
FIGS. 5A through 5C are drawings illustrating a method of producing a semiconductor device according to the first embodiment.

First, as illustrated by FIG. 5A, nitride semiconductor layers are formed on the substrate 10 such as a semi-insulating SiC substrate by epitaxial growth according to metal-organic vapor phase epitaxy (MOVPE). Alternatively, the nitride semiconductor layers may be formed on the substrate 10 by epitaxial growth according to molecular beam epitaxy (MBE).

More specifically, the nucleation layer 11, the channel layer 12, and an n-GaN film 13f are formed in sequence on the substrate 10 by MOVPE. The n-GaN film 13f is formed as a preparation to form the contact layers 13. As source gases, trimethylaluminum (TMA) is used for Al, trimethylgallium (TMG) is used for Ga, and ammonia (NH$_3$) is used for N. Also, in forming the nitride semiconductor layers by MOVPE, the growth pressure is set at a value between 5 kPa and 100 kPa, and the substrate temperature is set at a value between 700° C. and 1200° C.

The nucleation layer 11 is an AlN film with a thickness of about 30 nm and formed by supplying TMA and NH$_3$ as source gases. The channel layer 12 is a GaN film with a thickness of about 3 μm and formed by supplying TMG and NH$_3$ as source gases. The n-GaN film 13f has a thickness of about 10 nm and formed by supplying TMG, NH$_3$, and SiH$_4$ as source gases. The n-GaN film 13f is doped with Si as an impurity element at a density of about $1 \times 10^{19}$ cm$^{-3}$.

Figure 5B:
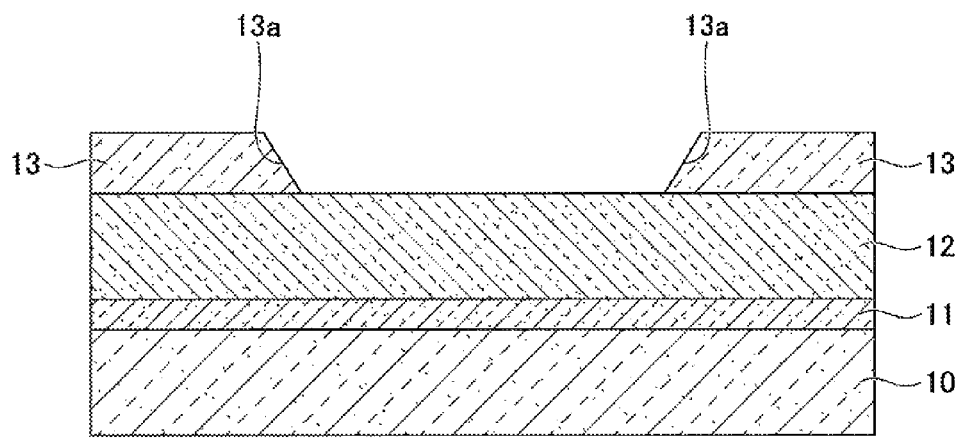

Next, as illustrated by FIG. 5B, a portion of the n-GaN film 13f is removed to form the contact layers 13. More specifically, a photoresist is applied to the n-GaN film 13f, and the photoresist is exposed and developed by an exposure apparatus to form a resist pattern (not shown) covering areas where the contact layers 13 are to be formed. Next, a portion of the n-GaN film 13f not covered by the resist pattern is removed by dry etching using a chlorine gas as an etching gas until the surface of the channel layer 12 is exposed. Then, the resist pattern is removed by using, for example, an organic solvent. The remaining portions of the n-GaN film 13f form the contact layers 13. In the first embodiment, the contact layers 13 are formed to cover areas that include areas where the source electrode 32 and the drain electrode 33 are formed. As illustrated in FIG. 5B, the contact layers 13 may be formed such that the side surfaces 13a are inclined and the contact layers 13 become gradually wider toward the substrate 10. For example, the contact layers 13 may be formed to have the inclined side surfaces 13a by adjusting the conditions of dry etching or by adjusting the shape of the resist pattern using a positive photoresist.

Figure 5C:
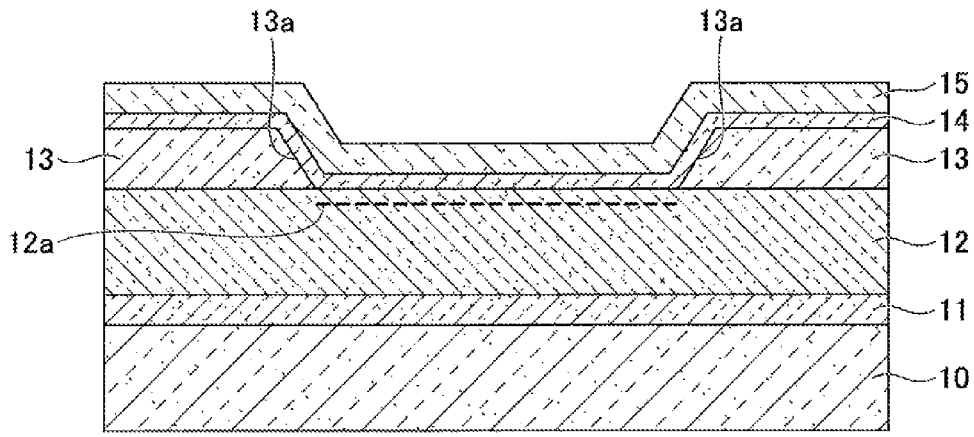

Next, as illustrated by FIG. 5C, the spacer layer 14 and the barrier layer 15 are sequentially formed by MOVPE on the exposed channel layer 12 and on the upper surfaces and the side surfaces 13a of the contact layers 13. With this configuration, the 2DEG 12a is generated in the channel layer 12 near the interface between the channel layer 12 and the spacer layer 14. In this step of forming the nitride semiconductor layers by MOVPE, the growth pressure is set at a value between 5 kPa and 100 kPa, and the substrate temperature is set at a value between 700° C. and 1200° C. The spacer layer 14 is an AlN film with a thickness of about 1 nm and formed by supplying TMA and NH$_3$ as source gases. The barrier layer 15 is an In$_{0.17}$Ga$_{0.83}$N film with a thickness of about 10 nm and formed by supplying trimethylindium (TMI), TMA, and NH$_3$ as source gases. Thus, the spacer layer 14 and the barrier layer 15 are stacked on the exposed channel layer 12 and on the upper surfaces and the side surfaces 13a of the contact layers 13. After this step, although not illustrated by figures, an opening is formed in a device isolation area by photolithography, and device isolation is performed, for example, by dry etching using a chlorine gas or by ion implantation.

Figure 6A:
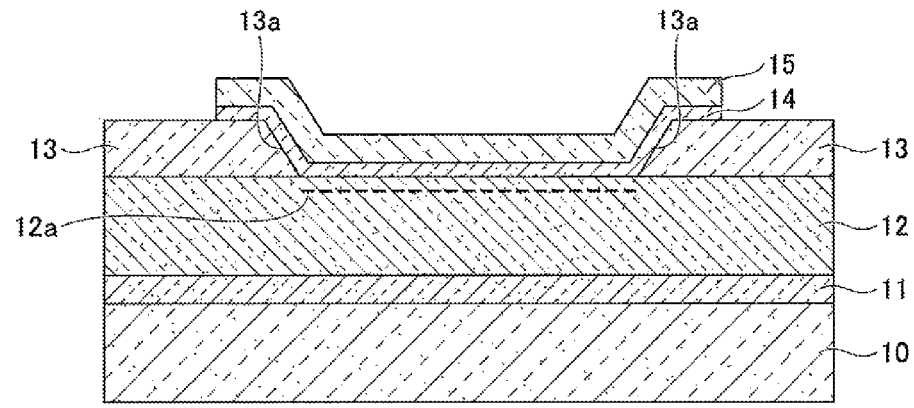
FIGS. 6A through 6C are drawings illustrating a method of producing a semiconductor device according to the first embodiment.

Next, as illustrated by FIG. 6A, portions of the spacer layer 14 and the barrier layer 15 on the contact layers 13, which correspond to areas where the source electrode 32 and the drain electrode 33 are to be formed, are removed. More specifically, a photoresist is applied to the barrier layer 15, and the photoresist is exposed and developed by an exposure apparatus to form a resist pattern (not shown) having openings in areas where the source electrode 32 and the drain electrode 33 are to be formed. Next, portions of the spacer layer 14 and the barrier layer 15 not covered by the resist pattern are removed by dry etching using a chlorine gas as an etching gas. As a result, the surfaces of the contact layers 13 are exposed in the areas where the source electrode 32 and the drain electrode 33 are to be formed. Then, the resist pattern is removed by using, for example, an organic solvent.

Figure 6B:
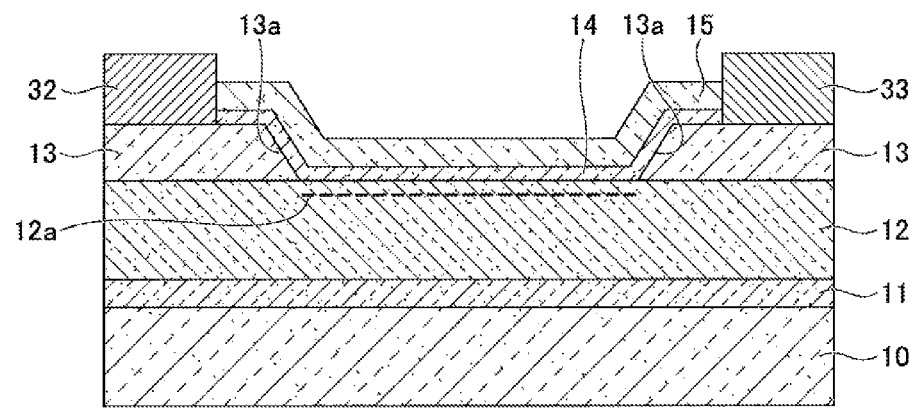

Next, as illustrated by FIG. 6B, the source electrode 32 and the drain electrode 33 are formed on the exposed contact layers 13. More specifically, a photoresist is applied to the barrier layer 15 and the contact layers 13, and the photoresist is exposed and developed by an exposure apparatus to form a resist pattern (not shown) having openings in areas where the source electrode 32 and the drain electrode 33 are to be formed. Next, a metal laminated film including Ta and Al and to be formed into the source electrode 32 and the drain electrode 33 is formed on the contact layers 13 and the resist pattern. The metal laminated film includes a Ta film having a thickness of about 20 nm and an Al film formed on the Ta film and having a thickness of about 200 nm, and is formed, for example, by vacuum deposition. Next, the metal laminated film is immersed in an organic solvent to remove, together with the resist pattern, a portion of the metal laminated film on the resist pattern by a lift-off technique. The remaining portions of the metal laminated film form the source electrode 32 and the drain electrode 33. Then, in a nitrogen atmosphere, a heat treatment is performed on the source electrode 32 and the drain electrode 33 at a temperature between 400° C. and 1000° C., for example, at 550° C., to form ohmic contacts between the contact layers 13 and the source electrode 32 and the drain electrode 33.

Figure 6C:
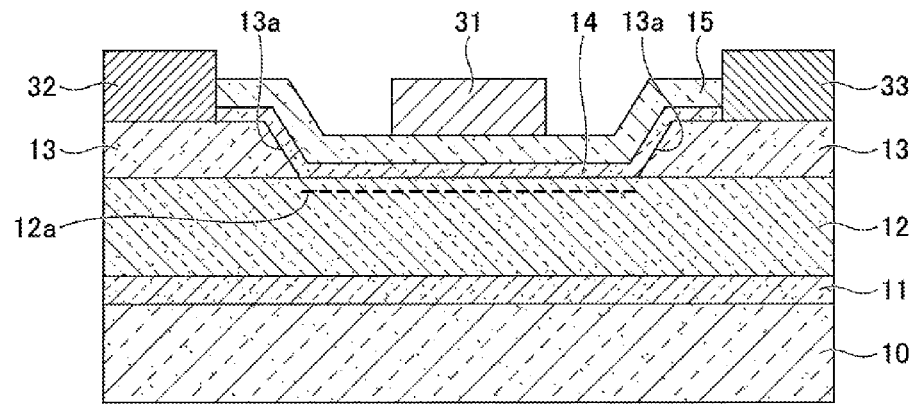

Next, as illustrated by FIG. 6C, the gate electrode 31 is formed on the barrier layer 15. More specifically, a photoresist is applied to the barrier layer 15, the source electrode 32, and the drain electrode 33, and the photoresist is exposed and developed by an exposure apparatus to form a resist pattern (not shown) having an opening in an area where the gate electrode 31 is to be formed. Next, a metal laminated film including Ni and Au and to be formed into the gate electrode 31 is formed on the barrier layer 15 and the resist pattern. The metal laminated film includes an Ni film having a thickness of about 30 nm and an Au film formed on the Ni film and having a thickness of about 400 nm, and is formed, for example, by vacuum deposition. Then, the metal laminated film is immersed in an organic solvent to remove, together with the resist pattern, portions of the metal laminated film on the resist pattern by a lift-off technique. The remaining portion of the metal laminated film forms the gate electrode 31.

The semiconductor device of the first embodiment may also include a passivation film formed on exposed portions of the barrier layer 15. For example, after the source electrode 32 and the drain electrode 33 are formed at the step of FIG. 6B, a passivation film having a thickness between 2 nm and 500 nm, e.g., 100 nm, is formed on the entire upper surface of the structure of FIG. 6B. The passivation film may also be formed by atomic layer deposition (ALD) or sputtering. The passivation film is preferably formed of an oxide, a nitride, or an oxynitride of Si, Al, Hf, Zr, Ti, Ta, or W, and is more preferably formed of SiN. Next, a resist pattern is formed to have an opening in a portion of an area where the gate electrode 31 is to be formed, and the passivation film in the opening is removed by dry etching using a fluorine gas or a chlorine gas as an etching gas. Instead of dry etching, wet etching using, for example, hydrofluoric acid or buffered hydrofluoric acid may be employed for this purpose. After this step, the gate electrode 31 is formed as illustrated by FIG. 6C.

With the semiconductor device of the first embodiment, because the influence of alloy scattering of the barrier layer 15 formed of InAlN is suppressed by the spacer 14 formed of AlN, the sheet resistance can be reduced.

The layer structures of the gate electrode 31, the source electrode 32, and the drain electrode 33 are just examples. Each of the gate electrode 31, the source electrode 32, and the drain electrode 33 may have a single-layer structure or a multilayer structure. Also, the gate electrode 31, the source electrode 32, and the drain electrode 33 may be formed by any other methods. In the first embodiment, a heat treatment is performed on the source electrode 32 and the drain electrode 33 after they are formed. However, the heat treatment may be omitted as long as ohmic characteristics are obtained. Also, a heat treatment may be performed on the gate electrode 31. Although the semiconductor device of the first embodiment employs a Schottky gate structure, a metal-insulator-semiconductor (MIS) gate structure may instead be used.

In the first embodiment, the barrier layer 15 is formed of InAlN. However, the barrier layer 15 may instead be formed of AlGaN or InAlGaN. To increase the spontaneous polarization, the composition ratio of In is preferably less than or equal to 20%. That is, the barrier layer 15 is preferably formed of $In_{x1}Al_{y1}Ga_{1-x1-y1}N$ ($0<x1\leq0.2$, $0<y1<1$), and more preferably formed of $In_{x1}Al_{y1}Ga_{1-x1-y1}N$ ($0.1\leq x1\leq0.2$, $0<y1\leq0.9$).

Also in the first embodiment, the spacer layer 14 is formed of AlN. However, the spacer layer 14 may instead be formed of AlGaN or InAlGaN. To suppress alloy scattering, the composition ratio of In is preferably less than or equal to 5%. That is, the spacer layer 14 is preferably formed of $In_{x2}Al_{y2}Ga_{1-x2-y2}N$ ($0\leq x2\leq0.05$, $0<y2\leq1$).

Although a semi-insulating SiC substrate is used as the substrate 10 in the present embodiment, any other type of substrate may also be used as long as nitride semiconductors are used for an epitaxial structure that functions as a field-effect transistor. The substrate 10 may have either a semi-insulating property or a conductive property. For example, the substrate 10 may be implemented by a conductive SiC substrate, a sapphire substrate, a GaN substrate, an Si substrate, or a diamond substrate.

The above-described configuration of the semiconductor device is an example, and the semiconductor device may have any other appropriate configuration as a field-effect transistor. For example, a GaN or AlN cap layer may be formed as the uppermost layer of the semiconductor device.

Although Si is used as an n-type impurity element of the n-GaN film 13f (the contact layers 13) in the first embodiment, Ge or Sn may be used instead of Si.

Second Embodiment

<Semiconductor Device>

Figure 7:
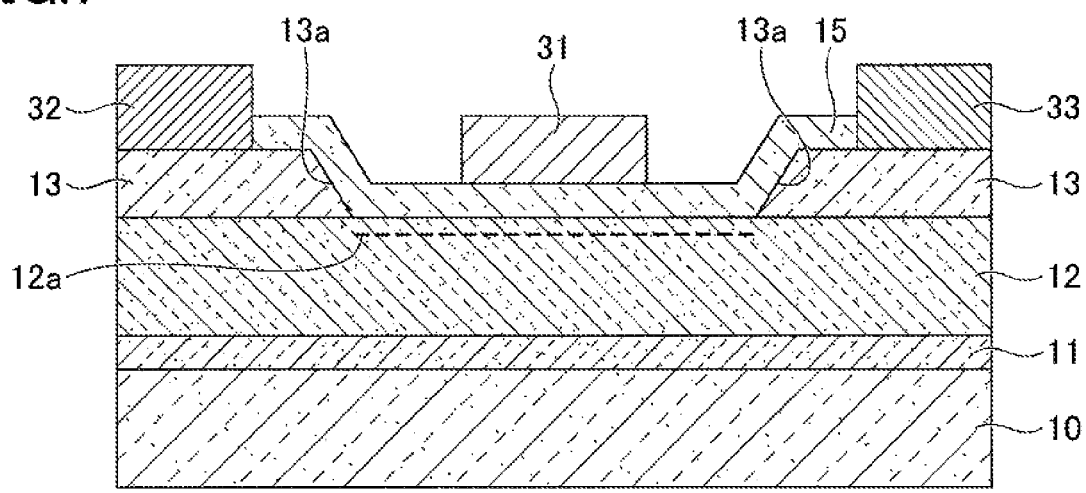
FIG. 7 is a drawing illustrating an exemplary configuration of a semiconductor device according to a second embodiment.

Next, a semiconductor device according to a second embodiment is described. As illustrated by FIG. 7, the semiconductor device of the second embodiment includes a substrate 10 such as a semi-insulating SiC substrate, and a nucleation layer 11 and a channel layer 12 that are formed on the substrate 10. Contact layers 13 are formed on portions of the channel layer 32 corresponding to areas where a source electrode 32 and a drain electrode 33 are to be formed, and the source electrode 32 and the drain electrode 33 are formed on the contact layers 13. A barrier layer 15 is formed on a portion of the channel layer 12 where the contact layers 13 are not formed and on side surfaces 13a of the contact layers 13. With this configuration, a 2DEG 12a is generated in the channel layer 12 near the interface between the channel layer 12 and the barrier layer 15. Also, a gate electrode 31 is formed on a portion of the barrier layer 15 corresponding to an area where the contact layers 13 are not formed. The contact layers 13 are wider than the source electrode 32 and the drain electrode 33. The barrier layer 15 may be formed also on portions of the contact layers 13 where the source electrode 32 and the drain electrode 33 are not formed.

<Method of Producing Semiconductor Device>

Next, an exemplary method of producing a semiconductor device according to the second embodiment is described with reference to FIGS. 8A through 9C.

Figure 8A:
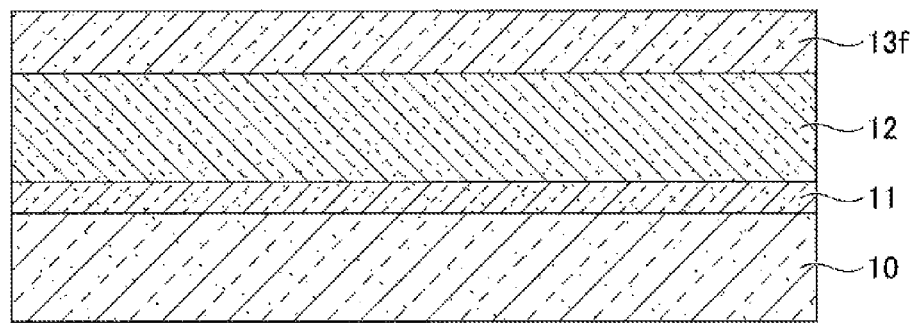
FIGS. 8A through 8C are drawings illustrating a method of producing a semiconductor device according to the second embodiment.

First, as illustrated by FIG. 8A, nitride semiconductor layers are formed on the substrate 10 such as a semi-insulating SiC substrate by epitaxial growth according to metal-organic vapor phase epitaxy (MOVPE). Alternatively, the nitride semiconductor layers may be formed on the substrate 10 by epitaxial growth according to molecular beam epitaxy (MBE). More specifically, the nucleation layer 11, the channel layer 12, and an n-GaN film 13f are formed in sequence on the substrate 10 by MOVPE.

Figure 8B:
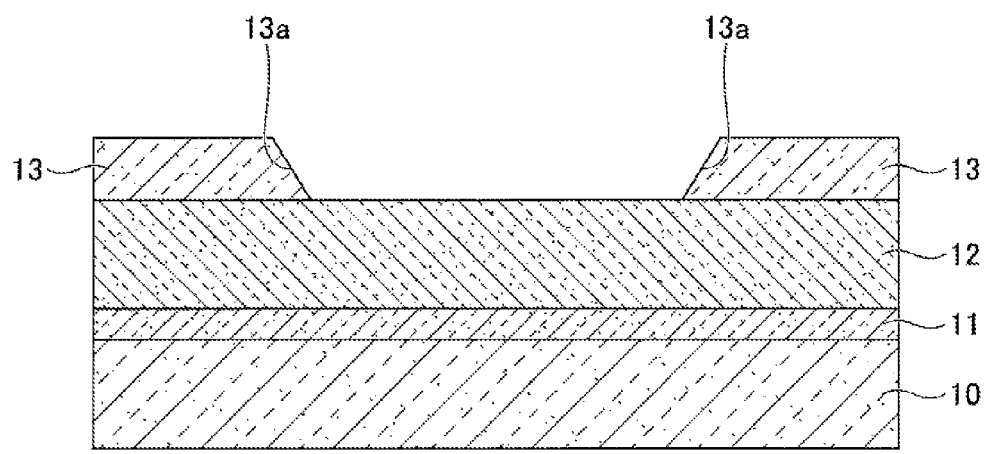

Next, as illustrated by FIG. 8B, a portion of the n-GaN film 13f is removed to form the contact layers 13. More specifically, a photoresist is applied to the n-GaN film 13f, and the photoresist is exposed and developed by an exposure apparatus to form a resist pattern (not shown) covering areas where the contact layers 13 are to be formed. Next, a portion of the n-GaN film 13f not covered by the resist pattern is removed by dry etching using a chlorine gas as an etching gas until the surface of the channel layer 12 is exposed. Then, the resist pattern is removed by using, for example, an organic solvent. The remaining portions of the n-GaN film 13f form the contact layers 13. In the second embodiment, the contact layers 13 are formed to cover areas that include areas where the source electrode 32 and the drain electrode 33 are formed.

Figure 8C:
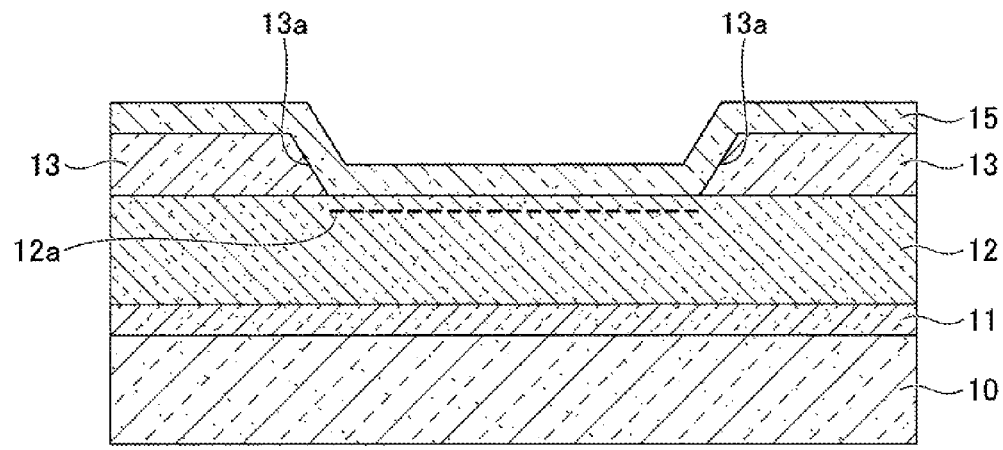

Next, as illustrated by FIG. 8C, the barrier layer 15 is formed by MOVPE on the exposed channel layer 12 and on the upper surfaces and the side surfaces 13a of the contact layers 13. With this configuration, the 2DEG 12a is generated in the channel layer 12 near the interface between the channel layer 12 and the barrier layer 15. After this step, although not illustrated by figures, an opening is formed in a device isolation area by photolithography, and device isolation is performed, for example, by dry etching using a chlorine gas or by ion implantation.

Figure 9A:
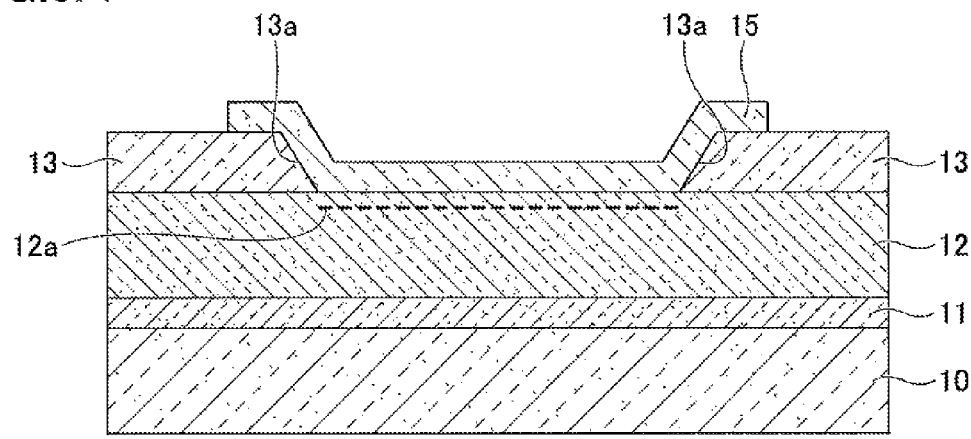
FIGS. 9A through 9C are drawings illustrating a method of producing a semiconductor device according to the second embodiment.

Next, as illustrated by FIG. 9A, portions of the barrier layer 15 on the contact layers 13, which correspond to areas where the source electrode 32 and the drain electrode 33 are to be formed, are removed. More specifically, a photoresist is applied to the barrier layer 15, and the photoresist is exposed and developed by an exposure apparatus to form a resist pattern (not shown) having openings in areas where the source electrode 32 and the drain electrode 33 are to be formed. Next, portions of the barrier layer 15 not covered by the resist pattern are removed by dry etching using a chlorine gas as an etching gas. As a result, the surfaces of the contact layers 13 are exposed in areas where the source electrode 32 and the drain electrode 33 are to be formed. Then, the resist pattern is removed by using, for example, an organic solvent.

Figure 9B:
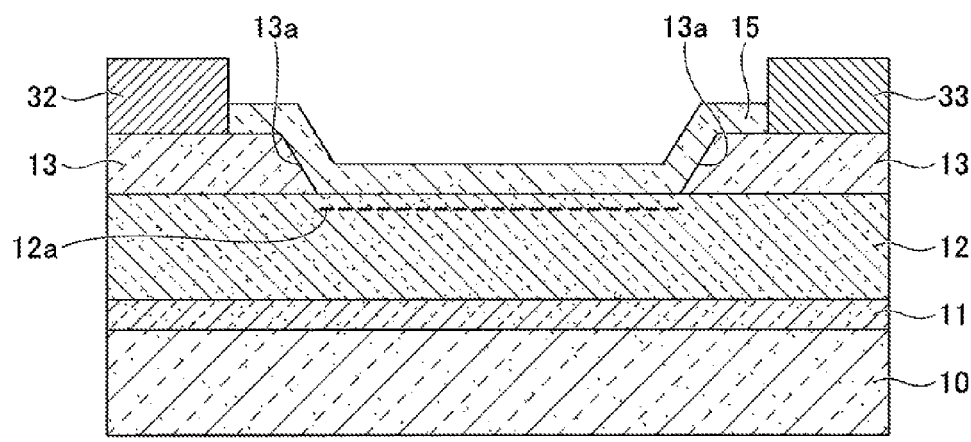

Next, as illustrated by FIG. 9B, the source electrode 32 and the drain electrode 33 are formed on the exposed contact layers 13. More specifically, a photoresist is applied to the barrier layer 15 and the contact layers 13, and the photoresist is exposed and developed by an exposure apparatus to form a resist pattern (not shown) having openings in areas where the source electrode 32 and the drain electrode 33 are to be formed. Next, a metal laminated film including Ta and Al and to be formed into the source electrode 32 and the drain electrode 33 is formed on the contact layers 13 and the resist pattern. The metal laminated film includes a Ta film having a thickness of about 20 nm and an Al film formed on the Ta film and having a thickness of about 200 nm, and is formed, for example, by vacuum deposition. Next, the metal laminated film is immersed in an organic solvent to remove, together with the resist pattern, a portion of the metal laminated film on the resist pattern by a lift-off technique. The remaining portions of the metal laminated film form the source electrode 32 and the drain electrode 33. Then, in a nitrogen atmosphere, a heat treatment is performed on the source electrode 32 and the drain electrode 33 at a temperature between 400° C. and 1000° C., for example, at 550° C., to form ohmic contacts between the contact layers 13 and the source electrode 32 and the drain electrode 33.

Figure 9C:
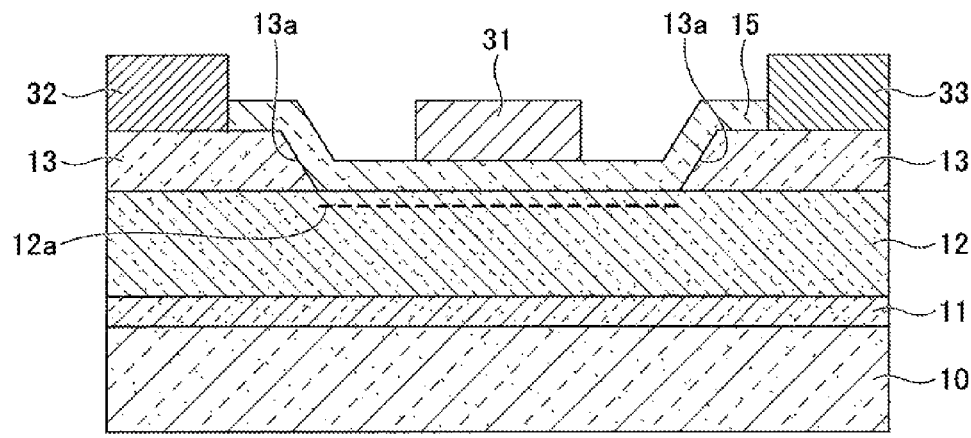

Next, as illustrated by FIG. 9C, the gate electrode 31 is formed on the barrier layer 15. More specifically, a photoresist is applied to the barrier layer 15, the source electrode 32, and the drain electrode 33, and the photoresist is exposed and developed by an exposure apparatus to form a resist pattern (not shown) having an opening in an area where the gate electrode 31 is to be formed. Next, a metal laminated film including Ni and Au and to be formed into the gate electrode 31 is formed on the barrier layer 15 and the resist pattern. The metal laminated film includes an Ni film having a thickness of about 30 nm and an Au film formed on the Ni film and having a thickness of about 400 nm, and is formed, for example, by vacuum deposition. Next, the metal laminated film is immersed in an organic solvent to remove, together with the resist pattern, portions of the metal laminated film on the resist pattern by a lift-off technique. The remaining portion of the metal laminated film forms the gate electrode 31.

The semiconductor device of the second embodiment may also include a passivation film formed on exposed portions of the barrier layer 15.

Configurations and methods not described above are substantially the same as those of the first embodiment.

Third Embodiment

<Semiconductor Device>

Figure 10:
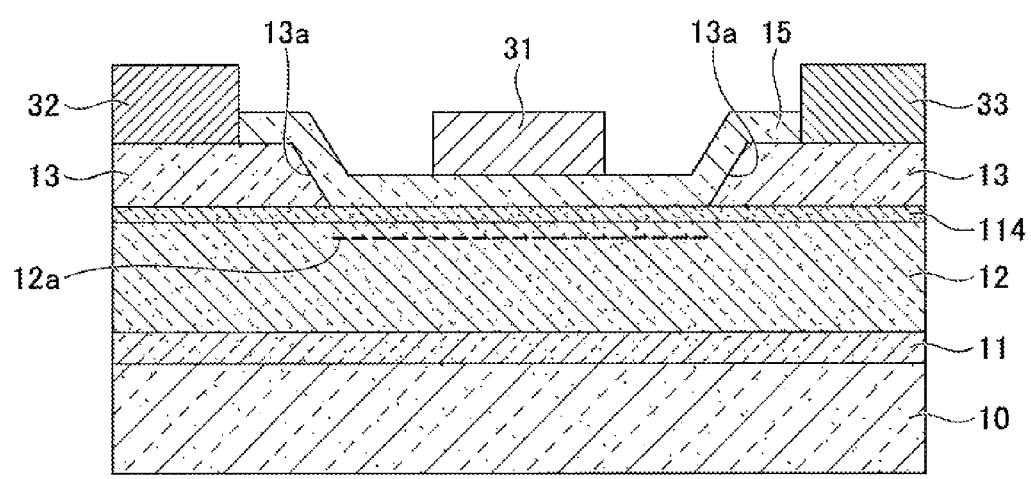
FIG. 10 is a drawing illustrating an exemplary configuration of a semiconductor device according to a third embodiment.

Next, a semiconductor device according to a third embodiment is described. As illustrated by FIG. 10, the semiconductor device of the third embodiment includes a substrate 10 such as a semi-insulating SiC substrate, and a nucleation layer 11, a channel layer 12, and a spacer layer 114 that are formed on the substrate 10. Contact layers 13 are formed on portions of the spacer layer 114 corresponding to areas where a source electrode 32 and a drain electrode 33 are to be formed, and the source electrode 32 and the drain electrode 33 are formed on the contact layers 13. A barrier layer 15 is formed on a portion of the spacer layer 114 where the contact layers 13 are not formed and on side surfaces 13a of the contact layers 13. Also, a gate electrode 31 is formed on a portion of the barrier layer 15 corresponding to an area where the contact layers 13 are not formed With this configuration, a 2DEG 12a is generated in the channel layer 12 near the interface between the channel layer 12 and the spacer layer 114. The contact layers 13 are wider than the source electrode 32 and the drain electrode 33. The barrier layer 15 may be formed also on portions of the contact layers 13 where the source electrode 32 and the drain electrode 33 are not formed. Thus, in the semiconductor device of the third embodiment, the spacer layer 114 is formed between the channel layer 12 and the barrier layer 15 and between the contact layers 13 and the channel layer 12. The spacer layer 114 is formed of AlN.

<Method of Producing Semiconductor Device>

Next, an exemplary method of producing a semiconductor device according to the third embodiment is described with reference to FIGS. 11A through 12C.

Figure 11A:
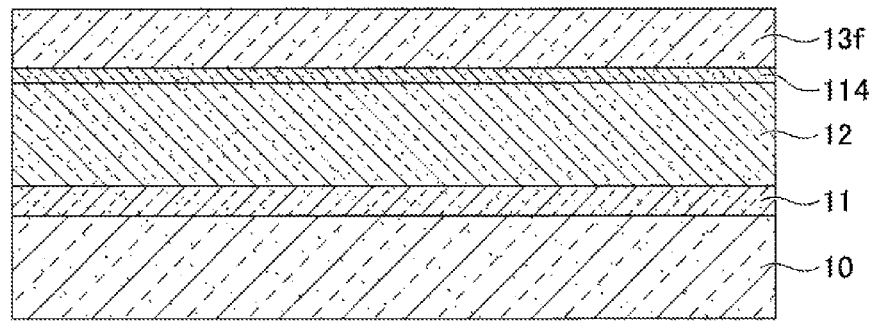
FIGS. 11A through 11C are drawings illustrating a method of producing a semiconductor device according to the third embodiment.

First, as illustrated by FIG. 11A, nitride semiconductor layers are formed on the substrate 10 such as a semi-insulating SiC substrate by epitaxial growth according to metal-organic vapor phase epitaxy (MOVPE). Alternatively, the nitride semiconductor layers may be formed on the substrate 10 by epitaxial growth according to molecular beam epitaxy (MBE).

More specifically, the nucleation layer 11, the channel layer 12, the spacer layer 114, and an n-GaN film 13f are formed in sequence on the substrate 10 by MOVPE. The spacer layer 114 is an AlN film with a thickness of about 1 nm and formed by supplying TMA and NH$_3$ as source gases.

Figure 11B:
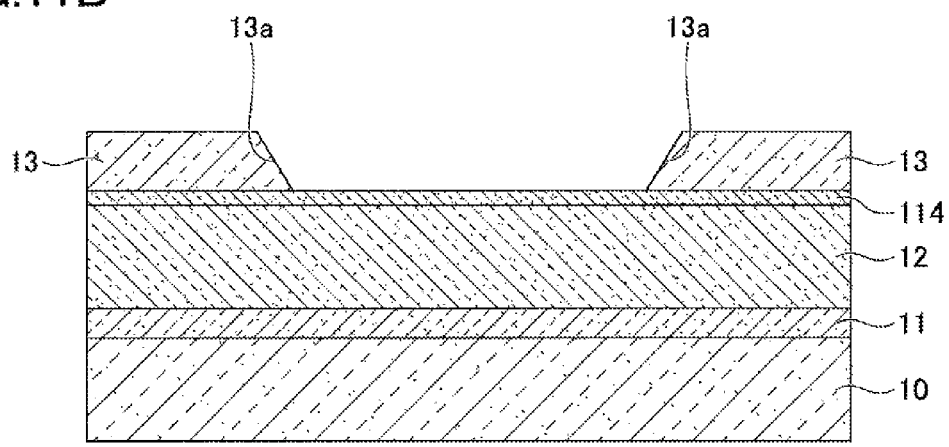

Next, as illustrated by FIG. 11B, a portion of the n-GaN film 13f is removed to form the contact layers 13. More specifically, a photoresist is applied to the n-GaN film 13f, and the photoresist is exposed and developed by an exposure apparatus to form a resist pattern (not shown) covering areas where the contact layers 13 are to be formed. Next, a portion of the n-GaN film 13f not covered by the resist pattern is removed by dry etching using a chlorine gas as an etching gas until the surface of the spacer layer 114 is exposed. Then, the resist pattern is removed by using, for example, an organic solvent. The remaining portions of the n-GaN film 13f form the contact layers 13. In the third embodiment, the contact layers 13 are formed to cover areas that include areas where the source electrode 32 and the drain electrode 33 are formed. In the third embodiment, the spacer layer 114 formed of AlN functions as a stopper in etching the n-GaN film 13f. Thus, the spacer layer 114 prevents the channel layer 12 from being overetched, and makes it possible to remove only the predetermined portion of the n-GaN film 13f.

Figure 11C:
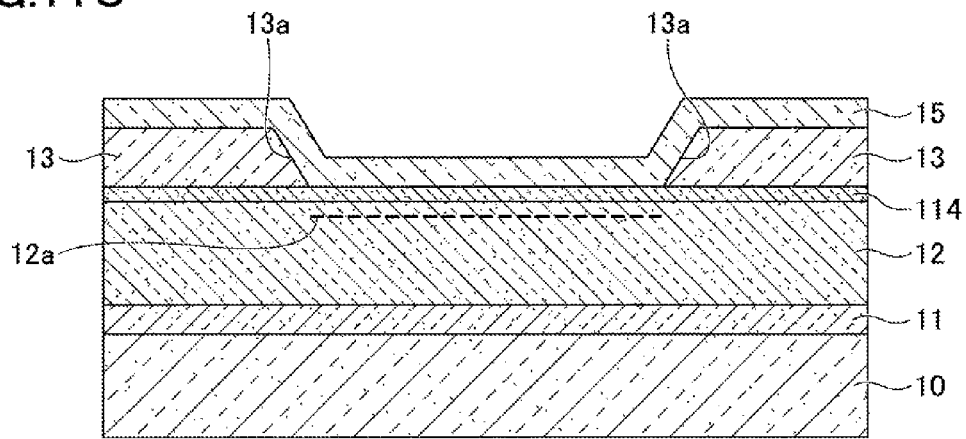

Next, as illustrated by FIG. 11C, the barrier layer 15 is formed by MOVPE on the exposed spacer layer 114 and on the upper surfaces and the side surfaces 13a of the contact layers 13. With this configuration, the 2DEG 12a is generated in the channel layer 12 near the interface between the channel layer 12 and the spacer layer 114. After this step, although not illustrated by figures, an opening is formed in a device isolation area by photolithography, and device isolation is performed, for example, by dry etching using a chlorine gas or by ion implantation.

Figure 12A:
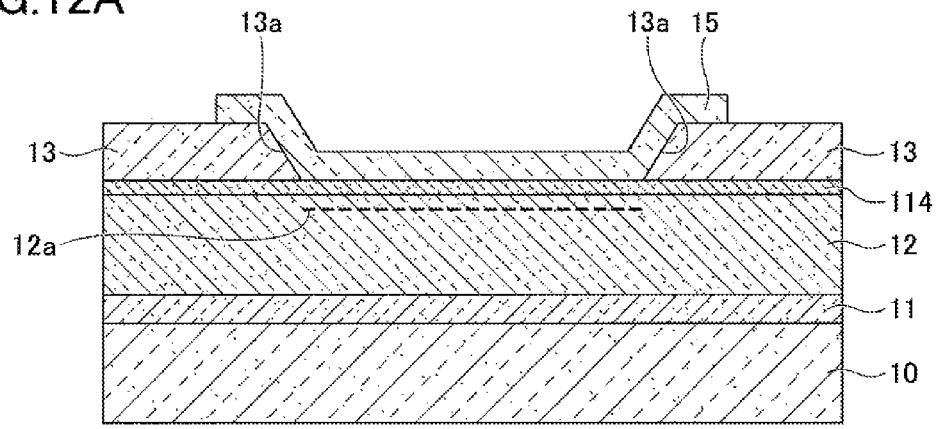
FIGS. 12A through 12C are drawings illustrating a method of producing a semiconductor device according to the third embodiment.

Next, as illustrated by FIG. 12A, portions of the barrier layer 15 on the contact layers 13, which correspond to areas where the source electrode 32 and the drain electrode 33 are to be formed, are removed. More specifically, a photoresist is applied to the barrier layer 15, and the photoresist is exposed and developed by an exposure apparatus to form a resist pattern (not shown) having openings in areas where the source electrode 32 and the drain electrode 33 are to be formed. Next, portions of the barrier layer 15 not covered by the resist pattern are removed by dry etching using a chlorine gas as an etching gas. As a result, the surfaces of the contact layers 13 are exposed in areas where the source electrode 32 and the drain electrode 33 are to be formed. Then, the resist pattern is removed by using, for example, an organic solvent.

Figure 12B:
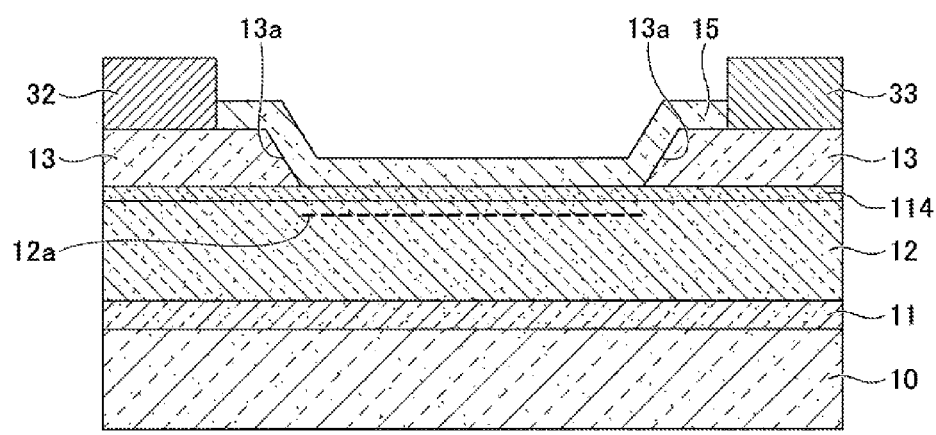

Next, as illustrated by FIG. 12B, the source electrode 32 and the drain electrode 33 are formed on the exposed contact layers 13. More specifically, a photoresist is applied to the barrier layer 15 and the contact layers 13, and the photoresist is exposed and developed by an exposure apparatus to form a resist pattern (not shown) having openings in areas where the source electrode 32 and the drain electrode 33 are to be formed. Next, a metal laminated film including Ta and Al and to be formed into the source electrode 32 and the drain electrode 33 is formed on the contact layers 13 and the resist pattern. The metal laminated film includes a Ta film having a thickness of about 20 nm and an Al film formed on the Ta film and having a thickness of about 200 nm, and is formed, for example, by vacuum deposition. Next, the metal laminated film is immersed in an organic solvent to remove, together with the resist pattern, a portion of the metal laminated film on the resist pattern by a lift-off technique. The remaining portions of the metal laminated film form the source electrode 32 and the drain electrode 33. Then, in a nitrogen atmosphere, a heat treatment is performed on the source electrode 32 and the drain electrode 33 at a temperature between 400° C. and 1000° C., for example, at 550° C., to form ohmic contacts between the contact layers 13 and the source electrode 32 and the drain electrode 33.

Figure 12C:
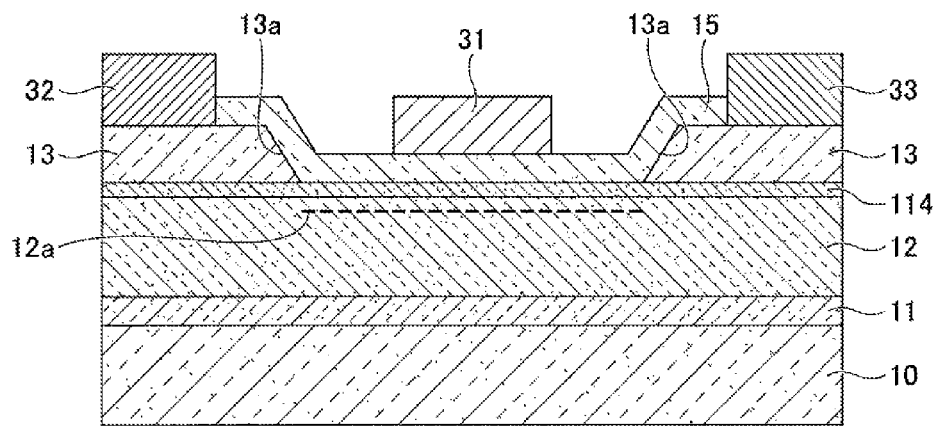

Next, as illustrated by FIG. 12C, the gate electrode 31 is formed on the barrier layer 15. More specifically, a photoresist is applied to the barrier layer 15, the source electrode 32, and the drain electrode 33, and the photoresist is exposed and developed by an exposure apparatus to form a resist pattern (not shown) having an opening in an area where the gate electrode 31 is to be formed. Next, a metal laminated film including Ni and Au and to be formed into the gate electrode 31 is formed on the barrier layer 15 and the resist pattern. The metal laminated film includes an Ni film having a thickness of about 30 nm and an Au film formed on the Ni film and having a thickness of about 400 nm, and is formed, for example, by vacuum deposition. Next, the metal laminated film is immersed in an organic solvent to remove, together with the resist pattern, portions of the metal laminated film on the resist pattern by a lift-off technique. The remaining portion of the metal laminated film forms the gate electrode 31.

The semiconductor device of the third embodiment may also include a passivation film formed on exposed portions of the barrier layer 15.

Configurations and methods not described above are substantially the same as those of the first embodiment.

Fourth Embodiment

<Semiconductor Device>

Figure 13:
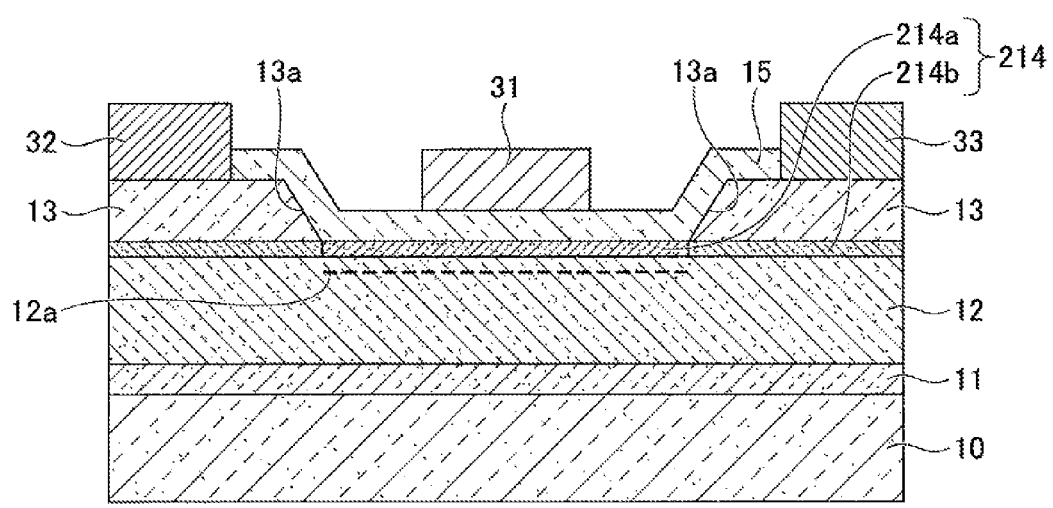
FIG. 13 is a drawing illustrating an exemplary configuration of a semiconductor device according to a fourth embodiment.

Next, a semiconductor device according to a fourth embodiment is described. As illustrated by FIG. 13, the semiconductor device of the fourth embodiment includes a substrate 10 such as a semi-insulating SiC substrate, and a nucleation layer 11, a channel layer 12, and a spacer layer 214 that are formed on the substrate 10. The spacer layer 214 includes a first spacer layer 214a formed in an area where contact layers 13 are not formed, and second spacer layers 214b formed in areas where the contact layer 13 are formed. The contact layers 13 are formed on the second spacer layers 214b, and the source electrode 32 and the drain electrode 33 are formed on the contact layers 13. A barrier layer 15 is formed on the first spacer layer 214a and on side surfaces 13a of the contact layers 13. Also, a gate electrode 31 is formed on a portion of the barrier layer 15 above the first spacer layer 214a. With this configuration, a 2DEG 12a is generated in the channel layer 12 near the interface between the channel layer 12 and the spacer layer 214. The contact layers 13 are wider than the source electrode 32 and the drain electrode 33. The barrier layer 15 may be formed also on portions of the contact layers 13 where the source electrode 32 and the drain electrode 33 are not formed. Thus, in the semiconductor device of the fourth embodiment, the first spacer layer 214a is formed between the channel layer 12 and the barrier layer 15, and the second spacer layers 214b are formed between the channel layer 12 and the contact layers 13.

In the fourth embodiment, the spacer layer 214 is formed of AlGaN. The composition ratio of Al in the first spacer layer 214a is greater than the composition ratio of Al in the second spacer layers 214b. Also, the thickness of the first spacer layer 214a is less than the thickness of the second spacer layers 214b.

<Method of Producing Semiconductor Device>

Next, an exemplary method of producing a semiconductor device according to the fourth embodiment is described with reference to FIGS. 14A through 15C.

Figure 14A:
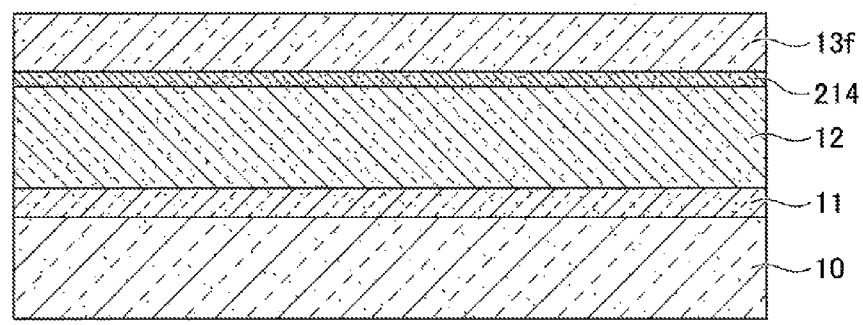
FIGS. 14A through 14C are drawings illustrating a method of producing a semiconductor device according to the fourth embodiment.

First, as illustrated by FIG. 14A, nitride semiconductor layers are formed on the substrate 10 such as a semi-insulating SiC substrate by epitaxial growth according to metal-organic vapor phase epitaxy (MOVPE). Alternatively, the nitride semiconductor layers may be formed on the substrate 10 by epitaxial growth according to molecular beam epitaxy (MBE).

More specifically, the nucleation layer 11, the channel layer 12, the spacer layer 214, and an n-GaN film 13f are formed in sequence on the substrate 10 by MOVPE. The spacer layer 214 is an $Al_{0.2}Ga_{0.8}N$ film with a thickness of about 2 nm and formed by supplying TMA, TMG, and $NH_3$ as source gases.

Figure 14B:
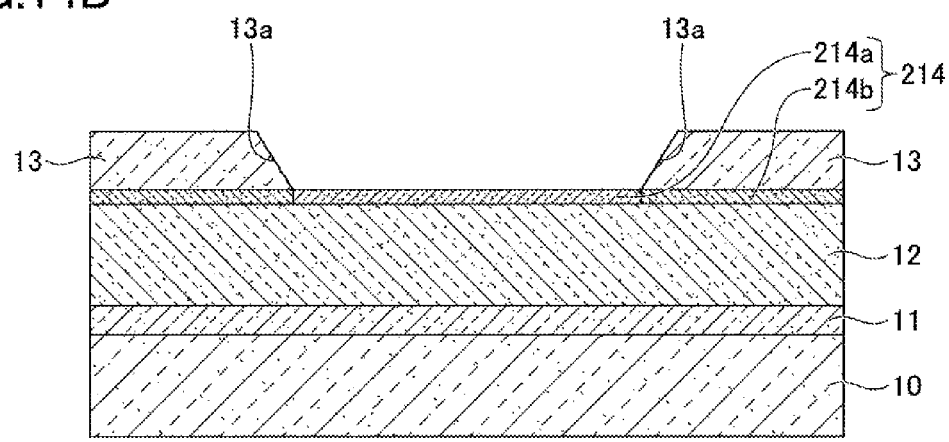

Next, as illustrated by FIG. 14B, a portion of the n-GaN film 13f is removed by dry etching and thermal etching to form the contact layers 13. More specifically, a photoresist is applied to the n-GaN film 13f, and the photoresist is exposed and developed by an exposure apparatus to form a resist pattern (not shown) covering areas where the contact layers 13 are to be formed. Next, a portion of the n-GaN film 13f in an area not covered by the resist pattern is removed by dry etching using a chlorine gas as an etching gas until the thickness of the n-GaN film 13f becomes about one tenth of its original thickness. Then, in an $NH_3+H_2$ atmosphere, thermal etching is performed at 900° C. on the remaining n-GaN film 13f in the area.

The thermal etching is performed by heating the remaining n-GaN film 13f to a temperature of 900° C. Due to the heating, Ga is eliminated from the remaining n-GaN film 13f and N is also eliminated together with Ga. As a result, the remaining n-GaN film 13f is removed. In this step, Ga is also partially eliminated from a portion of the spacer layer 214 exposed in the area where the n-GaN film 13f is removed. As a result, the composition ratio of Al in the portion of the spacer layer 214 increases. This portion of the spacer layer 214 from which Ga is partially eliminated becomes the first spacer layer 214a, and other portions of the spacer layer 214, which are covered by the contact layers 13 and from which Ga is not eliminated, become the second spacer layers 214b. Because Ga is partially removed from the first spacer layer 214a, the composition ratio of Al in AlGaN forming the first spacer layer 214a becomes higher than the composition ratio of Al in AlGaN forming the second spacer layers 214b. For example, the composition of the first spacer layer 214a may be $Al_{0.2}Ga_{0.8}N$ and the composition of the second spacer layers 214b may be $Al_{0.5}Ga_{0.5}N$.

In the thermal etching, the n-GaN film 13f is isotropically etched. As a result, the side surfaces 13a of the contact layers 13 formed by etching the n-GaN film 13f are inclined such that the contact layers 13 become gradually wider toward the substrate 10. Also, because Ga is eliminated from the first spacer layer 214a due to thermal annealing, the thickness of the first spacer layer 214a decreases. As a result, the thickness of the first spacer layer 214a becomes less than the thickness of the second spacer layers 214b. After the thermal etching, the resist pattern is removed by using, for example, an organic solvent. The remaining portions of the n-GaN film 13f form the contact layers 13. In the fourth embodiment, the contact layers 13 are formed to cover areas that include areas where the source electrode 32 and the drain electrode 33 are formed.

Figure 14C:
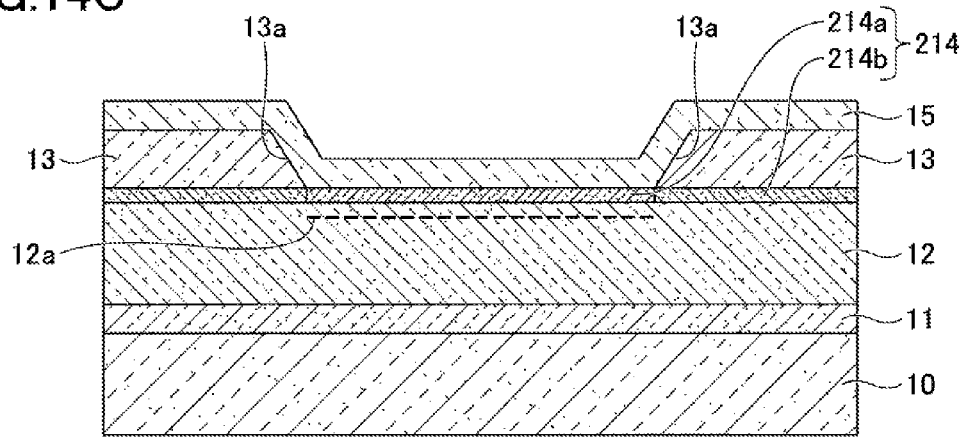

Next, as illustrated by FIG. 14C, the barrier layer 15 is formed by MOVPE on the exposed first spacer layer 214a and on the upper surfaces and the side surfaces 13a of the contact layers 13. With this configuration, the 2DEG 12a is generated in the channel layer 12 near the interface between the channel layer 12 and the spacer layer 214. After this step, although not illustrated by figures, an opening is formed in a device isolation area by photolithography, and device isolation is performed, for example, by dry etching using a chlorine gas or by ion implantation.

Figure 15A:
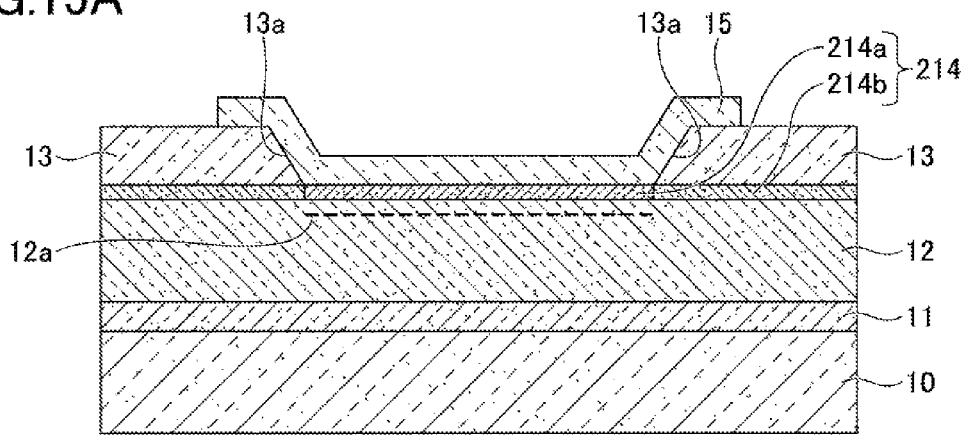
FIGS. 15A through 15C are drawings illustrating a method of producing a semiconductor device according to the fourth embodiment.

Next, as illustrated by FIG. 15A, portions of the barrier layer 15 on the contact layers 13, which correspond to areas where the source electrode 32 and the drain electrode 33 are to be formed, are removed. More specifically, a photoresist is applied to the barrier layer 15, and the photoresist is exposed and developed by an exposure apparatus to form a resist pattern (not shown) having openings in areas where the source electrode 32 and the drain electrode 33 are to be formed. Next, portions of the barrier layer 15 not covered by the resist pattern are removed by dry etching using a chlorine gas as an etching gas. As a result, the surfaces of the contact layers 13 are exposed in areas where the source electrode 32 and the drain electrode 33 are to be formed. Then, the resist pattern is removed by using, for example, an organic solvent.

Figure 15B:
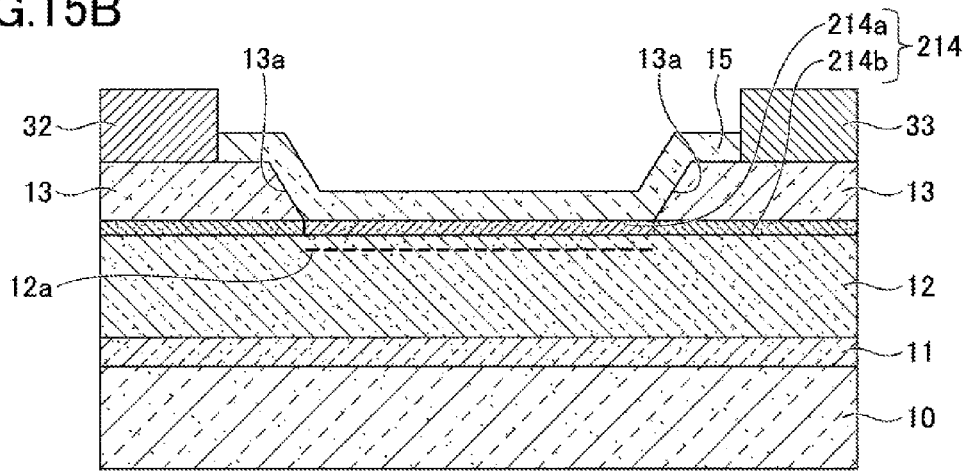

Next, as illustrated by FIG. 15B, the source electrode 32 and the drain electrode 33 are formed on the exposed contact layers 13. More specifically, a photoresist is applied to the barrier layer 15 and the contact layers 13, and the photoresist is exposed and developed by an exposure apparatus to form a resist pattern (not shown) having openings in areas where the source electrode 32 and the drain electrode 33 are to be formed. Next, a metal laminated film including Ta and Al and to be formed into the source electrode 32 and the drain electrode 33 is formed on the contact layers 13 and the resist pattern. The metal laminated film includes a Ta film having a thickness of about 20 nm and an Al film formed on the Ta film and having a thickness of about 200 nm, and is formed, for example, by vacuum deposition. Next, the metal laminated film is immersed in an organic solvent to remove, together with the resist pattern, a portion of the metal laminated film on the resist pattern by a lift-off technique. The remaining portions of the metal laminated film form the source electrode 32 and the drain electrode 33. Then, in a nitrogen atmosphere, a heat treatment is performed on the source electrode 32 and the drain electrode 33 at a temperature between 400° C. and 1000° C., for example, at 550° C., to form ohmic contacts between the contact layers 13 and the source electrode 32 and the drain electrode 33.

Figure 15C:
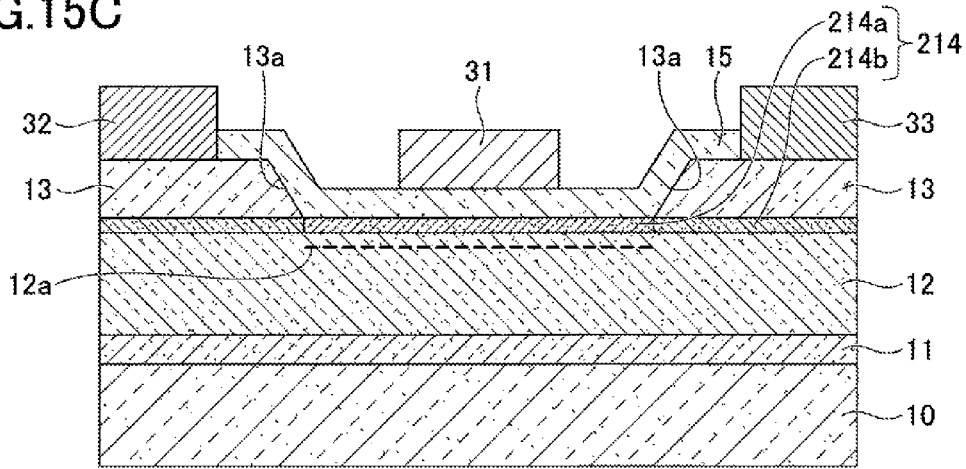

Next, as illustrated by FIG. 15C, the gate electrode 31 is formed on the barrier layer 15. More specifically, a photoresist is applied to the barrier layer 15, the source electrode 32, and the drain electrode 33, and the photoresist is exposed and developed by an exposure apparatus to form a resist pattern (not shown) having an opening in an area where the gate electrode 31 is to be formed. Next, a metal laminated film including Ni and Au and to be formed into the gate electrode 31 is formed on the barrier layer 15 and the resist pattern. The metal laminated film includes an Ni film having a thickness of about 30 nm and an Au film formed on the Ni film and having a thickness of about 400 nm, and is formed, for example, by vacuum deposition. Next, the metal laminated film is immersed in an organic solvent to remove, together with the resist pattern, portions of the metal laminated film on the resist pattern by a lift-off technique. The remaining portion of the metal laminated film forms the gate electrode 31.

The semiconductor device of the third embodiment may also include a passivation film formed on exposed portions of the barrier layer 15. In the semiconductor device of the fourth embodiment, because the Al composition ratio is high in the first spacer layer 214a, the resistance of the 2DEG 12a becomes low. Also, because the Al composition ratio is low in the second spacer layers 214b, the resistance of the second spacer layers 214b is low, and the resistance between the contact layers 13 and the channel layer 12 becomes low.

When the first spacer layer 214a is formed of $In_{x3}Al_{y3}Ga_{1-x3-y3}N$ (0≤x3≤0.05, 0<y3≤1) and the second spacer layers 214b are formed of $In_{x4}Al_{y4}Ga_{1-x4-y4}N$ (0≤x4≤0.05, 0<y4≤1), x3 is less than x4 (x3<x4) and y3 is greater than y4 (y3>y4). Also as described above, the thickness of the first spacer layer 214a is less than the thickness of the second spacer layers 214b.

Configurations and methods not described above are substantially the same as those of the first embodiment.

Fifth Embodiment

Next, a fifth embodiment is described. In the fifth embodiment, a packaged semiconductor device, a power-supply device, and a high-frequency amplifier are described.

The packaged semiconductor device of the fifth embodiment is produced by discretely packaging the semiconductor device of any one of the first through fourth embodiments.

Figure 16:
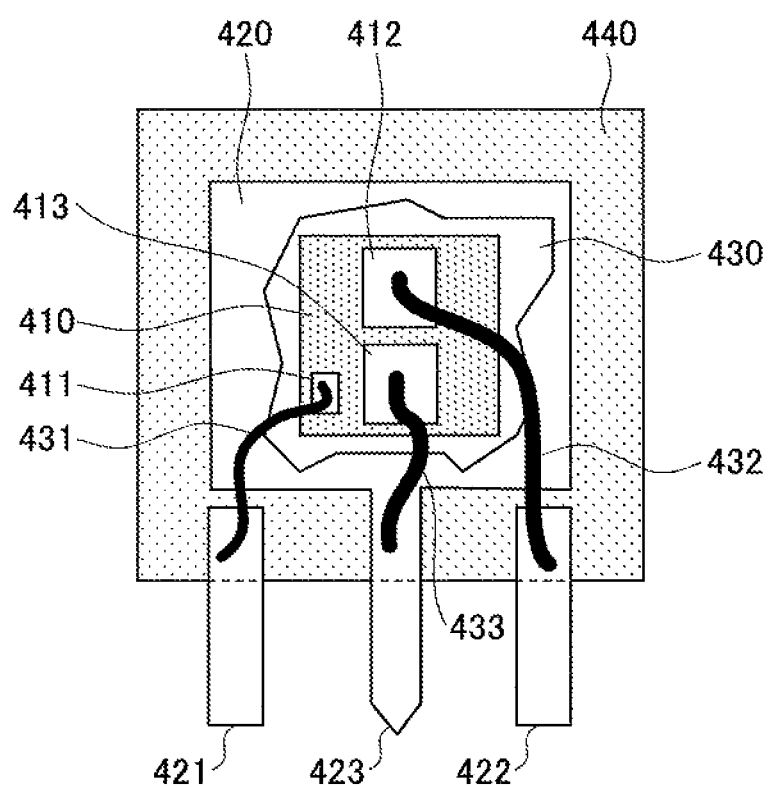
FIG. 16 is a drawing illustrating a discretely-packaged semiconductor device according to a fifth embodiment.

The discretely-packaged semiconductor device is described with reference to FIG. 16. FIG. 16 is a schematic diagram illustrating the internal configuration of the discretely-packaged semiconductor device. The arrangement of electrodes in the packaged semiconductor device is different from that in the first through fourth embodiments.

First, a semiconductor device is produced according to any one of the first through fourth embodiments and is diced to obtain a semiconductor chip 410 that is a HEMT including a GaN semiconductor material. The semiconductor chip 410 is fixed to a lead frame 420 via a die attach material 430 such as solder. The semiconductor chip 410 corresponds to the semiconductor device of any one of the first through fourth embodiments.

Next, a gate electrode 411 is connected via a bonding wire 431 to a gate lead 421, a source electrode 412 is connected via a bonding wire 432 to a source lead 422, and a drain electrode 413 is connected via a bonding wire 433 to a drain lead 423. The bonding wires 431, 432, and 433 are formed of a metal material such as Al. In the fifth embodiment, the gate electrode 411 is a gate electrode pad and is connected to the gate electrode 31 of the semiconductor device of any one of the first through fourth embodiments. The source electrode 412 is a source electrode pad and is connected to the source electrode 32 of the semiconductor device of any one of the first through fourth embodiments. The drain electrode 413 is a drain electrode pad and is connected to the drain electrode 33 of the semiconductor device of any one of the first through fourth embodiments.

Then, the semiconductor chip 410 is sealed with a molding resin 440 by transfer molding. Through the above process, a discretely-packaged semiconductor device of a HEMT including a GaN semiconductor material is produced.

Next, a power-supply device and a high-frequency amplifier of the fifth embodiment are described. Each of the power-supply device and the high-frequency amplifier includes the semiconductor device of any one of the first through fourth embodiments.

Figure 17:
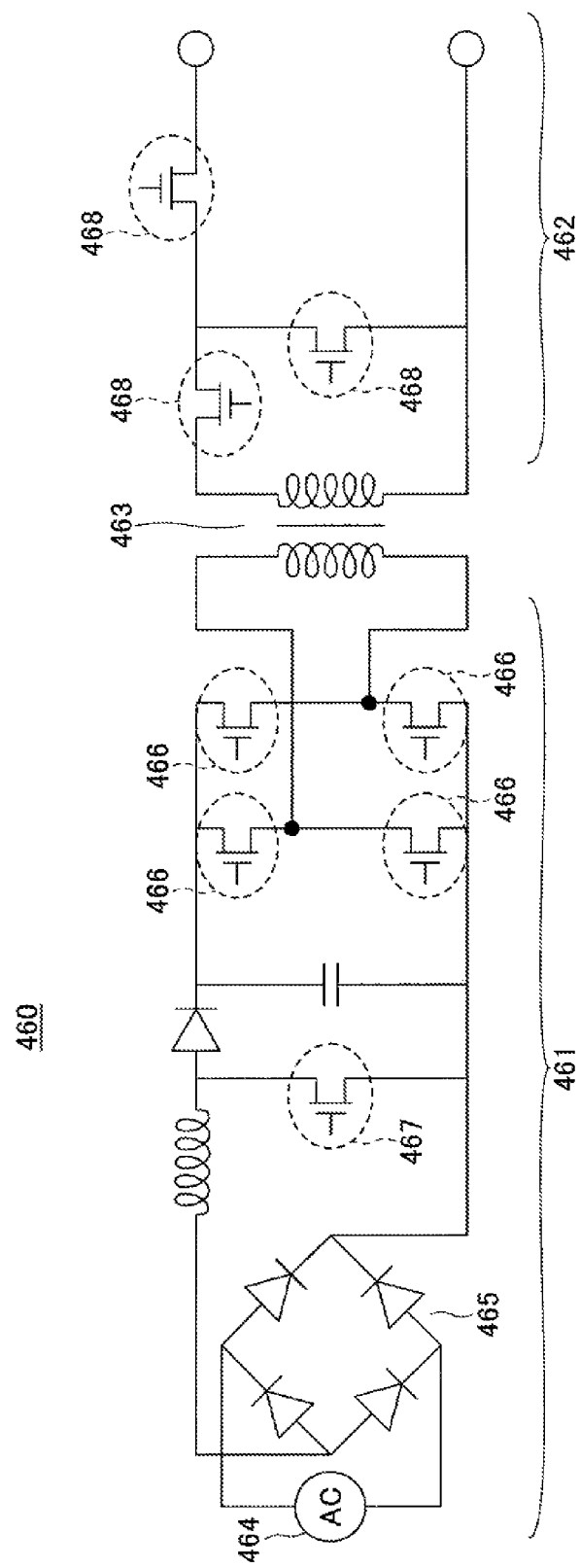
FIG. 17 is a circuit diagram of a power-supply device according to the fifth embodiment.

First, a power-supply device 460 of the fifth embodiment is described with reference to FIG. 17. The power-supply device 460 includes a high-voltage primary circuit 461, a low-voltage secondary circuit 462, and a transformer 463 disposed between the primary circuit 461 and the secondary circuit 462. The primary circuit 461 includes an alternator 464, a bridge rectifier circuit 465, multiple (in this example, four) switching elements 466, and a switching element 467. The secondary circuit 462 includes multiple (in this example, three) switching elements 468. In the example of FIG. 17, each of the switching elements 466 and 467 of the primary circuit 461 is implemented by the semiconductor device of any one of the first through fourth embodiments. Each of the switching elements 466 and 467 of the primary circuit 461 is preferably implemented by a "normally off" semiconductor device. Each of the switching elements 468 of the secondary circuit 462 may be implemented by a metal insulator semiconductor field effect transistor (MISFET).

Figure 18:
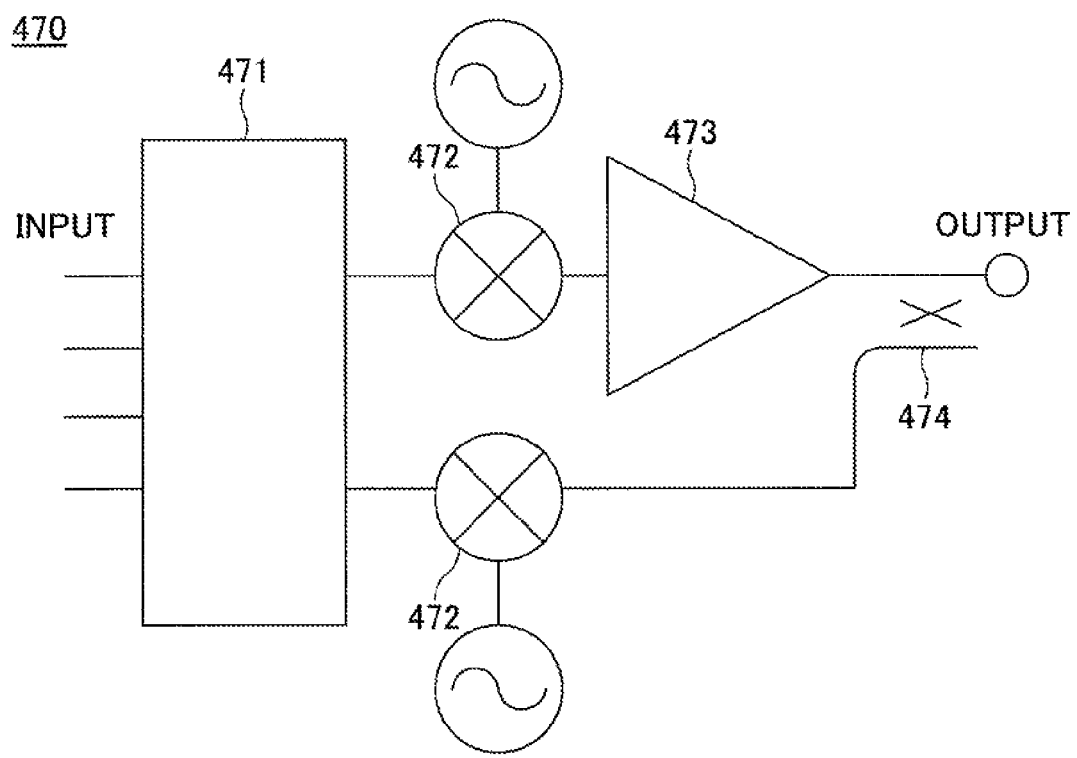
FIG. 18 is a drawing illustrating an exemplary configuration of a high-frequency amplifier according to the fifth embodiment.

Next, a high-frequency amplifier 470 of the fifth embodiment is described with reference to FIG. 18. The high-frequency amplifier 470 may be used, for example, for a power amplifier of a base station in a cell-phone system. The high-frequency amplifier 470 includes a digital predistortion circuit 471, mixers 472, a power amplifier 473, and a directional coupler 474. The digital predistortion circuit 471 compensates for the nonlinear distortion of an input signal. Each mixer 472 mixes the input signal whose non-linear distortion is compensated for with an alternating current signal. The power amplifier 473 amplifies the input signal mixed with the alternating current signal. In the example of FIG. 18, the power amplifier 473 includes the semiconductor device of any one of the first through fourth embodiments. The directional coupler 474, for example, monitors input signals and output signals. With the circuit of FIG. 18, for example, an output signal can be switched to the mixer 472 and mixed with an alternating-current signal, and the mixed signal can be output to the digital predistortion circuit 471.

An aspect of this disclosure provides a semiconductor device, e.g., a HEMT, that includes a barrier layer formed of InAlN and can achieve a low electrode contact resistance and a low 2DEG sheet resistance.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
   a substrate;
   a first semiconductor layer formed over the substrate;
   a plurality of contact layers formed over portions of the first semiconductor layer;
   a second semiconductor layer formed over another portion of the first semiconductor layer and on lateral side surfaces of the plurality of contact layers;
   a source electrode formed on one of the plurality of contact layers;
   a drain electrode formed on another one of the plurality of contact layers; and
   a gate electrode formed on the second semiconductor layer, wherein
   the first semiconductor layer is formed of a material including GaN;
   the second semiconductor layer is formed of $In_{x1}Al_{y1}Ga_{1-x1-y1}N$ ($0<x1\leq0.2$, $0<y1<1$); and
   the plurality of contact layers are formed of a material including GaN.

2. The semiconductor device as claimed in claim 1, wherein the second semiconductor layer is formed of $In_{x1}Al_{y1}Ga_{1-x1-y1}N$ ($0.1\leq x1\leq0.2$, $0<y1\leq0.9$).

3. The semiconductor device as claimed in claim 1, further comprising:
   a third semiconductor layer formed between the first semiconductor layer and the second semiconductor layer,
   wherein the third semiconductor layer is formed of $In_{x2}Al_{y2}Ga_{1-x2-y2}N$ ($0\leq x2\leq0.05$, $0<y2\leq1$).

4. The semiconductor device as claimed in claim 3, wherein the third semiconductor layer is also formed between the second semiconductor layer and each of the plurality of contact layers.

5. The semiconductor device as claimed in claim 3, wherein the third semiconductor layer is also formed between the first semiconductor layer and each of the plurality of contact layers.

6. The semiconductor device as claimed in claim 5, wherein the third semiconductor layer includes a first portion formed between the first semiconductor layer and the second semiconductor layer and a second portion formed between the first semiconductor layer and each of the plurality of contact layers;

the first portion of the third semiconductor layer is formed of $In_{x3}Al_{y3}Ga_{1-x3-y3}N$ ($0 \leq x3 \leq 0.05$, $0 < y3 \leq 1$);

the second portion of the third semiconductor layer is formed of $In_{x4}Al_{y4}Ga_{1-x4-y4}N$ ($0 \leq x4 \leq 0.05$, $0 < y4 \leq 1$); and y3 is greater than y4.

7. The semiconductor device as claimed in claim 6, wherein a thickness of the first portion is less than a thickness of the second portion.

8. The semiconductor device as claimed in claim 1, wherein the lateral side surfaces of the plurality of contact layers are inclined such that the plurality of contact layers become gradually wider toward the substrate.

9. The semiconductor device as claimed in claim 1, wherein the plurality of contact layers include an n-type impurity element.

10. A power-supply device comprising the semiconductor device of claim 1.

11. An amplifier comprising the semiconductor device of claim 1.

* * * * *